United States Patent [19]

Rogers

[11] Patent Number: 4,479,247
[45] Date of Patent: Oct. 23, 1984

[54] ELECTRONIC CHANNEL SELECTOR

[76] Inventor: Noel A. Rogers, 9121 W. 70th St., Shawnee Mission, Kans. 66204

[21] Appl. No.: 442,960

[22] Filed: Nov. 19, 1982

[51] Int. Cl.³ .............................................. H04B 1/26
[52] U.S. Cl. .................................... 455/179; 334/15; 455/77; 455/195; 455/196
[58] Field of Search ............... 455/161, 168, 179, 196, 455/197, 199, 193, 77, 195; 331/162, 179; 334/11, 14, 15

[56] References Cited

U.S. PATENT DOCUMENTS 3,824,475  7/1974  Pflasterer ............................ 455/168

*Primary Examiner*—Marc E. Bookbinder
*Attorney, Agent, or Firm*—Kokjer, Kircher, Bradley, Wharton, Bowman & Johnson

[57] ABSTRACT

Disclosed is an electronic channel selector comprising a plurality of diodes in series with a plurality of crystals, each diode/crystal connection defining one channel of the ten channel crystal-controlled oscillator. Non-enabled diodes are maintained in a reverse bias condition, preventing the associated crystal from oscillating in the oscillation circuit. The diode corresponding to the selected channel is forward biased into conduction permitting the associated crystal to control the oscillator circuitry providing the desired frequency output. When the selected diode is forward biased and begins conducting current, it conducts current through a path which provides a tuning voltage which may advantageously be utilized in a transmitter exciter filter or receiver preselector. A binary switch is manually set for the desired channel and produces a binary coded output. A binary-to-decimal decoder provides a single enabling output which is determined by the binary code supplied from the binary switch. The decoder output is inverted and forward biases the diode corresponding to the selected channel.

10 Claims, 2 Drawing Figures

ELECTRONIC CHANNEL SELECTOR

BACKGROUND OF THE INVENTION

The present invention relates generally to channel selection in transmitter or receiver systems, and specifically to an electronic channel selector for such systems. Combinations of transmitters and receivers (transceivers) have been used to provide air, marine, and ground communication for many years. Generally, such transceivers are equipped with more than one channel and a means for changing the transmit/receiver channel when desired by the operator.

The transmission frequency is generally fixed by a crystal-controlled oscillator, and channel selection is made conventionally by means of a multiposition switch connecting the desired crystal to the oscillator circuitry. However, foreign matter such as dirt or grease or wear of the switch contacts degrades the connection between the crystal and the oscillator circuit, thus adversely affecting the operation of the crystal/oscillator combination.

SUMMARY OF THE INVENTION

It is an object of the present invention to provide a channel selector for selecting one of a plurality of channels electronically without requiring mechanical switch connections between the crystals and the oscillator circuit.

It is a further object of the present invention to provide an electronic channel selector for selecting channels by means of a switch having a binary output.

It is a still further object of the present invention to provide, in a channel selector of the character described, a proper D.C. tuning voltage corresponding to the channel which is selected.

An additional object of the present invention is to provide an electronic channel selector of the character described wherein low-power CMOS integrated circuits are used for channel selection.

The above and other objects are achieved by connecting each of a plurality of crystals in series with a diode. Each diode/crystal combination is connected to the oscillator circuitry between a reference voltage and the base of the oscillator transistor. The junction of each crystal and diode is also connected to the output side of an inverter such that when the inverter output is "low", the corresponding diode will be forward biased into conduction and when the output is "high" the diode will be reverse biased against conduction. A binary switch controls the channel selection and supplies a binary signal to a binary-to-decimal decoder having a plurality of outputs. The decoder outputs generally remain "low", with the exception of the output which corresponds to the channel selected on the binary switch. The decoder outputs are fed to the inputs of the inverter such that the "high" decoder output becomes a "low" inverter output for the selected channel. This single low inverter output forward biases only one of the diodes into conduction and enables only the corresponding crystal.

Potentiometers are utilized to connect the inverter outputs to the crystal/diode junctions, and the potentiometer setting determines the current flow through the corresponding diode when the inverter output is "low". A current limiting resistor is placed in series between the reference voltage and the diodes, and a tuning voltage is developed across this resistor. Thus, by setting the potentiometers to different levels of resistance, different tuning voltages are developed depending upon which diode is forward biased into conduction, which is in turn determined by the setting of the binary switch.

BRIEF DESCRIPTION OF THE DRAWINGS

In the accompanying drawings which form a part of the specification and are to be read in conjunction therewith and in which like reference numerals are used to indicate like parts in the various views.

DETAILED DESCRIPTION OF THE INVENTION

Figure 1:
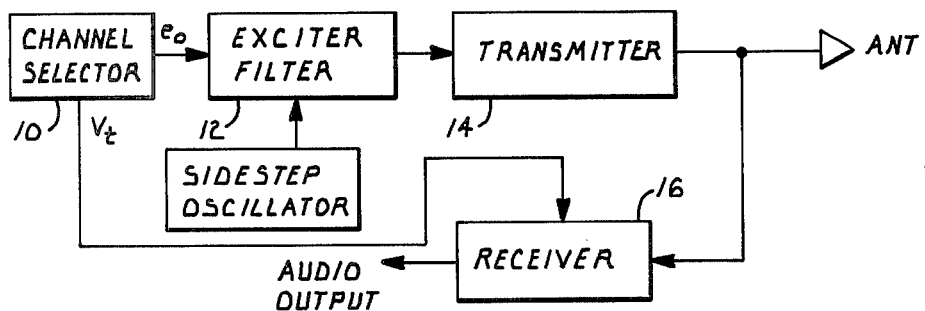
FIG. 1 is a block diagram illustrating the interrelationship between the channel selector and other elements of a typical transceiver.

Referring now more particularly to the drawings and initially to FIG. 1, numeral 10 generally designates the channel selection of the present invention in a typical transceiver application. The selected oscillator output from the channel selector ($e_o$) is supplied to the exciter filter 12. The output signal from the exciter filter is supplied to transmitter 14 and the antenna, as is known. A tuning voltage $V_t$ is also supplied from channel selector 10 to use in tuning the transmitter exciter filter as well as the receiver preselector. The transmit/receive relay and other peripheral elements of a typical transceiver have been omitted for clarity. The received signal is supplied from the antenna to the receiver 16.

Although the electronic channel selector of the present invention is shown in connection with a transceiver, it can be utilized with a transmitter or a receiver if requirements so dictate. Additionally, although the preferred embodiment supplies both the oscillator output $e_o$ and the tuning voltage $V_t$, the channel selector could be utilized to provide one or both of these to separate transmitters or receivers or combinations thereof.

Figure 2:
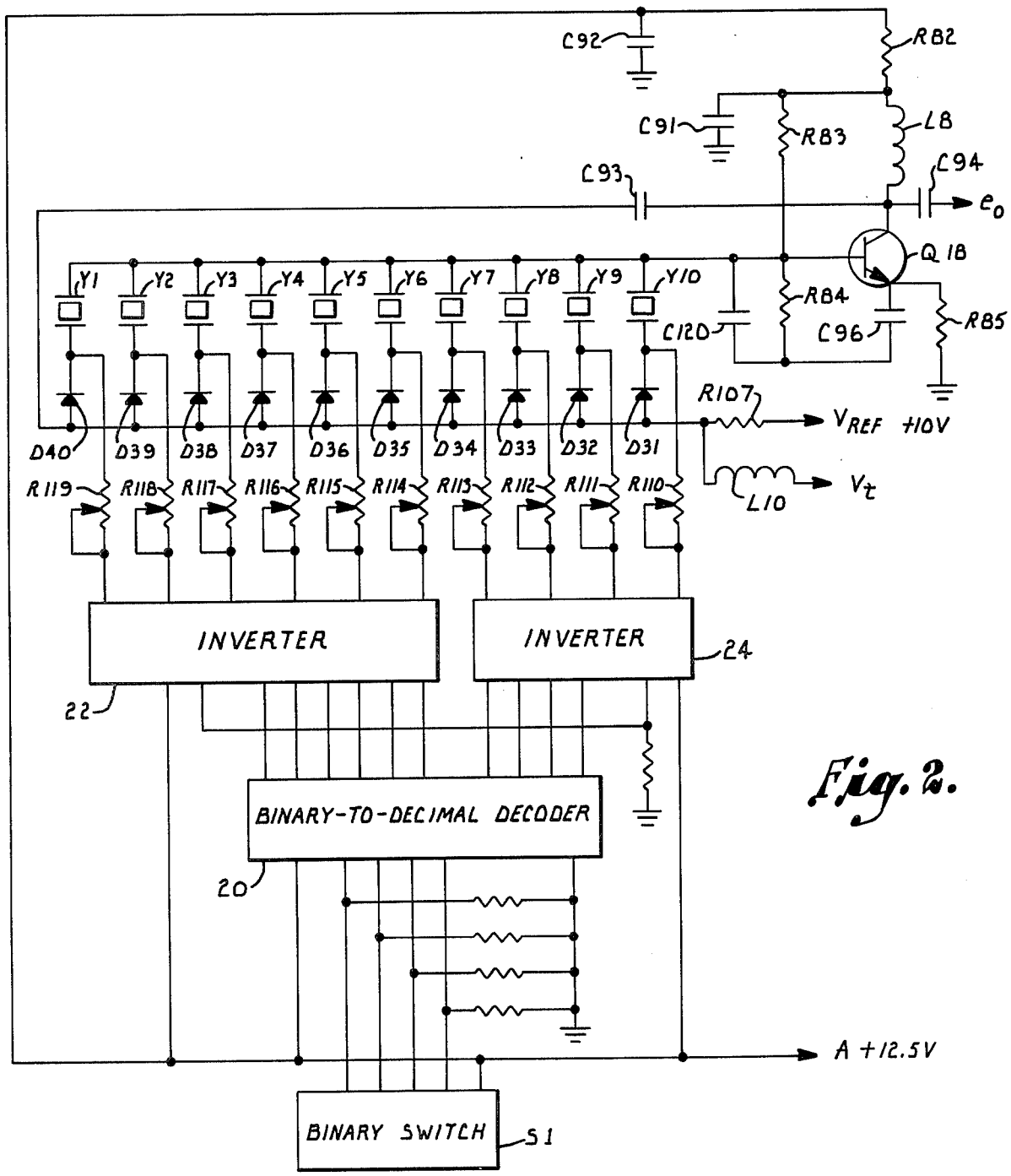
FIG. 2 is a detailed electrical schematic of a channel selector constructed and arranged in accordance with a preferred embodiment of the present invention.

Tuning to FIG. 2, the binary switch S1 provides a binary coded output identifying one and only one of the ten channels selected by the electronic channel selector. The availability of binary coded decimal (BCD) thumbwheel switches renders such a switch attractive for use in the electronic channel selector. A binary coded decimal switch generally comprises two or more separate switches each of which puts out a four-bit binary code indicative of the numbers 0 through 9. Thus, with two switches (and two 4-bit binary codes), a total of 99 channel selections are possible. However, in the preferred embodiment of the present invention, only a single BCD thumbwheel switch is utilized and is referred to as binary switch S1.

The binary output signal from switch S1 is decoded in a binary-to-decimal decoder 20 which enables one of ten output lines corresponding to the binary code supplied by switch S1. In the preferred embodiment, the enabled output will be a "high" output relative to the other, non-enabled outputs. The outputs from decoder 20 are supplied to inverters 22 and 24, which are conventional 6-channel inverters (although in inverter 24, only four of the channels are actually utilized). Because each input is inverted, the enabling "high" input will be inverted to an enabling "low" output from the inverter corresponding to the selected channel set by binary switch S1.

The output signals from the inverters 22 and 24 are applied through variable potentiometers R110-R119, respectively, and to the junctions between respective sets of diodes D31-D40 are crystals Y10-Y1.

The oscillator is a conventional Pierce oscillator utilizing a parallel mode crystal connected between the collector and base of the oscillator transistor Q18. The crystals are enabled and operate in the oscillator feedback circuit when the diode associated with the oscillator is forward biased into conduction. Thus, the channel selector forward biases only one diode at a time and maintains the remaining nine diodes in a reverse bias condition. The current for forward biasing the diodes is supplied from a 10 volt reference voltage source $V_{ref}$ through resistor R107. The reverse bias voltage is supplied to each of the diodes through the corresponding potentiometers R110-R119 when the corresponding inverter output is in the non-enabling "high" conditon.

It can be seen that if a "low" output from one of the inverters 22 or 24 is applied to the junction between the corresponding diode and its crystal, the diode is forward biased into conduction and current flows from the reference voltage source $V_{ref}$ through resistor R107 and the forward biased diode and the associated potentiometer to the inverter output which acts as a current sink. Assuming that the "low" condition of each of the inverter outputs is the same, variations in the resistance set on potentiometers R110 through R119 will vary the current through the enabled diode and through R107 from the reference voltage source. This variable current flow through R107 will provide a variable voltage drop thereacross, which voltage serves as variable voltage drop thereacross, which voltage serves as the tuning voltage $V_t$, as previously discussed. An inductor L10 is utilized as an isolation choke in order to isolate the external receiver preselector and the transmitter exciter filter circuitry from the oscillator. Resistor R109 is in series with the common leads from inverters 22 and 24 in order to prevent the tuning voltage $V_t$ from dropping to 0 volts, rendering the oscillator inoperative.

To describe typical operation of the channel selector, it is assumed by way of example that channel number 1 is selected on binary switch S1. Line number 1 on the binary switch output would go "high", raising input pin 10 of the binary-to-decimal decoder 20 "high". The decoder output pin 14 is then "high", and the remaining output of the decoder remain "low". A "high" on pin 14 of the decoder output provides a "high" input on pin 1 of inverter 22 with "lows" supplied to the rest of the inverter inputs. The inversion of inverter 22 and 24 provides a "low" on pin 2 of inverter 22 and a "high" on all other inverter outputs. As previously discussed, the "low" in pin 2 permits current to flow from the reference voltage source $V_{ref}$ through resistor 107, diode D40 and potentiometer R119 into pin 2 of inverter 22. This forward biases diode D40 into construction, enabling crystal Y1 and allowing the necessary crystal feedback for operation of the oscillator transistor Q18 and an output $e_o$ which is a function of the characteristics of crystal Y1. Because the remainder of the inverter outputs are "high", they continue to reverse bias diodes D31-D39, maintaining crystals Y10-Y2 in a non-enabled condition.

It is desirable in the oscillator design that the circuit lead inductance and stray capacitance be kept to a minimum. Also, the resistance of the diodes should be less than 10 ohms when forward biased with one Ma of current flowing through the diode. Additionally, diode capacitance should be less than 0.3 pf with a reverse bias of 10 volts applied. Enablement of the diode crystal combination will normally be achieved when the resistance in series with the desired crystal is less than 10 ohms. The resistance in the non-enabled crystal/diode circuit will be larger than 1 meg ohm due to the high resistance of the reverse biased diode.

Thus, in view of the above teachings, numerous modifications and applications of the circuitry of FIG. 2 will become obvious to those of ordinary skill in the art. Different logic elements could be utilized with the diodes reversed such that a logical "high" output of the inverter is sufficient to bias the diode into conduction while a logical "low" maintains the remaining diodes in a reverse biased condition. Obviously, the component sizing will be commensurate with the frequency range anticipated by the oscillator circuit. Different types of crystal controlled oscillators could be utilized in conjunction with the above crystal/diode selection system to provide the oscillator output $e_o$. As previously noted, numerous devices could be utilized to provide the binary coded signal which is supplied to the binary-to-decimal decoder 20. Therefore, the invention has been described with respect to a particularly advantageous embodiment thereof, but is not limited to the specifications set forth herein. Therefore, the present invention is limited only in accordance with the appended claims.

Having thus described the invention, I claim:

1. An electronic channel selector for selecting one of a plurality of channels comprising:
   a plurality of diodes, each diode corresponding to one of said plurality of channels;
   a plurality of crystals, each crystal corresponding to one of said plurality of channels and being connected in series with a corresponding one of said plurality of diodes;
   means for setting a selected one of said plurality of channels;
   means, responsive to said setting means, for forward biasing the diode corresponding to said selected channel and for reverse biasing the diodes not corresponding to said selected channel;
   oscillator circuit means, connected to all of said crystals, for oscillating at a frequency determined by said crystal corresponding to said forward biased diode; and
   means connected in series with each diode for providing a tuning signal output which changes depending upon which of said diodes is forward biased.

2. The electronic channel selector according to claim 1, wherein said setting means comprises:
   binary switch means for providing a binary output dependent upon which of said plurality of channels is selected; and
   decoder means for providing a single enabling output indicative of said selected channel.

3. The electronic channel selector according to claim 2, wherein said forward and reverse biasing means comprises an inverter means, responsive to said enabling output, for forward biasing the diode corresponding to the selected diode.

4. The electronic channel selector according to claim 3, wherein said decoder has a plurality of outputs corresponding to said plurality of channels and said enabling output comprises a "high" compared with others of said decoder outputs;

said inverter means comprises a plurality of inverters, each having an input connected to a corresponding one of said decoder outputs, and an output, each of said plurality of inverters corresponding to one of said plurality of channels, said inverter output, corresponding to said enabling decoder output, comprises a "low" compared with other inverter outputs, each of said inverter outputs connected to a corresponding single connection between each of said crystals and each of said diodes; and said forward and reverse biasing means includes a reference voltage source connected to all of said diodes opposite said connections between said crystals and said diodes.

5. The electronic channel selector according to claim 4, wherein said inverter means further includes a plurality of potentiometers connected between corresponding inverter outputs and the connections between said diodes and crystals, for adjusting the tuning voltage signal provided by said means for providing a tuning signal output.

6. An electronic channel selector for selecting one of a plurality of available channels, said channel selector comprising:
  a plurality of diodes corresponding to the respective available channels;
  a crystal for each diode connected in series therewith and enabled when the corresonding diode is forward biased;
  switch means for selecting one of the available channels, said switch means providing a signal coded to correspond to the selected channel;
  means for using said signal to forward bias the diode corresponding to the selected channel and to reverse bias the diodes corresponding to the remaining channels, whereby the crystal corresponding to the selected channel is enabled and the remaining crystals are disabled;
  oscillator circuit means connected with each of the crystals and operable to oscillate at a frequency controlled by the crystal that is enabled;
  a variable resistance associated with each diode; and
  means for providing a tuning signal having a level dependent upon the resistance associated with the diode corresponding to the selected channel.

7. The channel selection of claim 6, wherein said switch means includes a binary switch having a different setting for each channel that is selected, said binary switch providing said signal in binary coded form corresponding to the selected channel.

8. An electronic channel selector for selecting one of a plurality of available channels, said channel selector comprising:
  binary coded switch means responsive to a selected one of a plurality of user selectable input settings for selecting a corresponding one of the available channels by providing a binary coded signal corresponding to said selected one setting;
  decoder means for receiving said binary coded signal and decoding same in a manner to provide a decoded signal corresponding to the selected channel;
  a plurality of circuit elements each having a first and second state, one of which is conductive and one of which is nonconductive, each circuit element corresponding to one of the available channels;
  a plurality of crystals connected in series with the respective circuit elements, each crystal being enabled in the first state of the corresponding circuit element and disabled in the second state of the corresponding circuit element;
  means for applying said decoded signal to the circuit element corresponding to the selected channel in a manner to effect the first state of same and to effect the second state of the remaining circuit elements; and
  oscillator circuit means connected to all of said crystals for oscillation at a frequency controlled by the crystal that is enabled, whereby the crystal corresponding to the selected channel controls the oscillation frequency.

9. The channel selector of claim 8, including:
means for applying a reference voltage to each circuit element;
a variable resistor connected in series with each circuit element in the conductive state thereof; and
means for providing a tuning signal having a level dependent upon the resistance of the variable resistor associated with the circuit element corresponding to the selected channel, whereby the tuning signal level varies with the selected channel.

10. The channel selector of claim 8, wherein:
each circuit element is a diode; and
said applying means comprises inverter means normally reverse biasing each diode to the nonconductive state and operable upon receipt of said decoded signal to forward bias the diode corresponding to the selected channel to the conductive state.

* * * * *